United States Patent
Karpov et al.

(10) Patent No.: US 11,374,056 B2
(45) Date of Patent: Jun. 28, 2022

(54) SELECTOR DEVICES

(71) Applicant: Intel Corporation, Santa Clara, CA (US)

(72) Inventors: Elijah V. Karpov, Portland, OR (US); Brian S. Doyle, Portland, OR (US); Ravi Pillarisetty, Portland, OR (US); Prashant Majhi, San Jose, CA (US); Abhishek A. Sharma, Hillsboro, OR (US)

(73) Assignee: Intel Corporation, Santa Clara, CA (US)

(*) Notice: Subject to any disclaimer, the term of this patent is extended or adjusted under 35 U.S.C. 154(b) by 96 days.

(21) Appl. No.: 16/630,924

(22) PCT Filed: Sep. 14, 2017

(86) PCT No.: PCT/US2017/051479
§ 371 (c)(1),
(2) Date: Jan. 14, 2020

(87) PCT Pub. No.: WO2019/055008
PCT Pub. Date: Mar. 21, 2019

(65) Prior Publication Data
US 2020/0235163 A1    Jul. 23, 2020

(51) Int. Cl.
*H01L 27/24* (2006.01)
*H01L 27/22* (2006.01)
*H01L 45/00* (2006.01)

(52) U.S. Cl.
CPC ........ *H01L 27/2427* (2013.01); *H01L 27/224* (2013.01); *H01L 45/04* (2013.01); *H01L 45/144* (2013.01)

(58) Field of Classification Search
CPC ... H01L 27/2427; H01L 27/224; H01L 45/04; H01L 45/144
See application file for complete search history.

(56) References Cited

U.S. PATENT DOCUMENTS

| | | | |
|---|---|---|---|
| 9,391,273 B1 | 7/2016 | Yoo | |
| 2004/0113137 A1* | 6/2004 | Lowrey | H01L 27/2427 257/5 |
| 2011/0207289 A1* | 8/2011 | Jeong | H01L 27/24 438/433 |
| 2016/0064666 A1 | 3/2016 | Chan et al. | |
| 2016/0118441 A1 | 4/2016 | Rawaswamy | |
| 2017/0062522 A1 | 3/2017 | Mujumdar et al. | |

FOREIGN PATENT DOCUMENTS

KR   20090006436 U   6/2009
WO   2019055008 A1   3/2019

OTHER PUBLICATIONS

Chapter 3, Academy of the Sciences USSR, 1984.
International Search Report and Written Opinion in International Application No. PCT/US2017/051479 dated Jan. 23, 2018, 8 pages.

* cited by examiner

*Primary Examiner* — Ermias T Woldegeorgis
(74) *Attorney, Agent, or Firm* — Patent Capital Group

(57) ABSTRACT

Disclosed herein are selector devices and related devices and techniques. In some embodiments, a selector device may include a first electrode, a second electrode, and a selector material between the first electrode and the second electrode. The selector material may include germanium, tellurium, and sulfur.

19 Claims, 4 Drawing Sheets

SELECTOR DEVICES

CROSS-REFERENCE TO RELATED APPLICATION

This application is a national stage application under 35 U.S.C. § 371 of PCT International Application Serial No. PCT/US2017/051479, filed on Sep. 14, 2017 and entitled "SELECTOR DEVICES," which is hereby incorporated by reference herein in its entirety.

BACKGROUND

A selector device is a two-terminal device exhibiting a volatile change in resistance. In an off state, a selector device may exhibit high resistance; in an on state, a selector device may exhibit low resistance.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

DETAILED DESCRIPTION

Figure 1A:
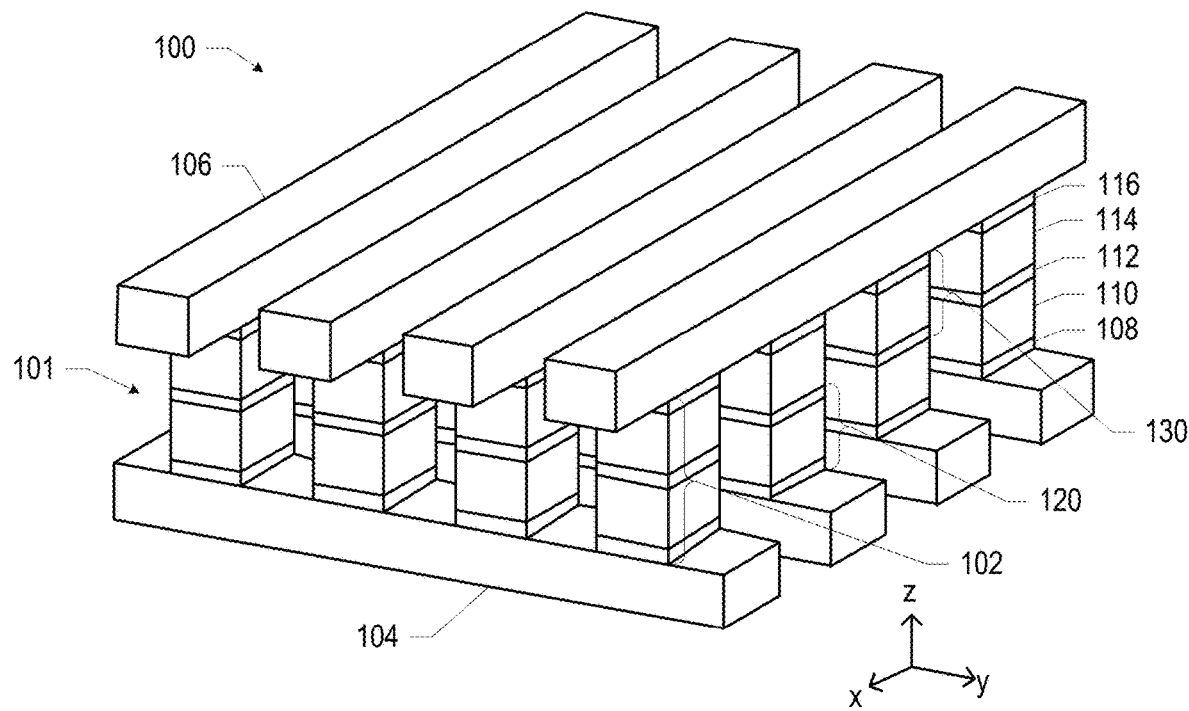
FIG. 1A is a perspective view of a portion of a memory array including a selector device, in accordance with various embodiments.

Disclosed herein are selector devices and related devices and techniques. In some embodiments, a selector device may include a first electrode, a second electrode, and a selector material between the first electrode and the second electrode. The selector material may include germanium, tellurium, and sulfur, as discussed further herein.

Some memory devices may be considered "standalone" devices in that they are included in a chip that does not also include computing logic (e.g., transistors for performing processing operations). Other memory devices may be included in a chip along with computing logic and may be referred to as "embedded" memory devices. Using embedded memory to support computing logic may improve performance by bringing the memory and the computing logic closer together and eliminating interfaces that increase latency. However, because embedded memory devices may have to meet the thermal, electrical, manufacturing, and other constraints imposed by the computing logic, some conventional memory architectures used in standalone devices may not be suitable for high performance embedded applications. For example, some conventional standalone memory devices may have a lower range of temperatures at which they should be maintained to avoid material degradation relative to the fabrication temperatures used during the manufacture of conventional computing logic; this "low temperature budget" for the memory devices may preclude the integration of these memory devices with computing logic whose fabrication uses higher temperatures. In another example, some conventional standalone memory devices may require high voltages for proper operation (e.g., for switching between different memory states); these voltages may be higher than those that can be effectively provided by conventional computing logic.

Various ones of the selector devices, memory cells, and/or memory arrays disclosed herein may enable the use of high density embedded memory in computing chips (e.g., embedded non-volatile memory, "eNVM"). For example, various ones of the selector devices, memory cells, and/or memory arrays disclosed herein may include a selector material that will not significantly degrade (e.g., by crystallization) at the operating temperatures of computing logic and thus may be used in embedded applications. More generally, various ones of the selector devices, memory cells, and/or memory arrays disclosed herein may provide performance improvements over some conventional devices.

In the following detailed description, reference is made to the accompanying drawings that form a part hereof, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C). As used herein, a "dopant" refers to an impurity material that is included in another material to alter the electrical properties of the other material. As used herein, an "embedded memory" refers to a memory device or array of devices that is included in a die along with computing logic (e.g., transistors arranged to perform processing operations).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The disclosure may use the singular term "layer," but the term "layer" should be understood to refer to assemblies that may include multiple different material layers. The accompanying drawings are not necessarily drawn to scale.

FIG. 1A is a perspective view of a portion of a memory array 100 including a selector device 130, in accordance with various embodiments. The memory array 100 may be a cross-point array including memory cells 102 located at the intersections of conductive lines 104 and conductive lines 106. In some embodiments, the conductive lines 104 may be word lines and the conductive lines 106 may be bit lines, for example; for ease of discussion, this terminology may be used herein to refer to the conductive lines 104 and the conductive lines 106. In the embodiment illustrated in FIG. 1A, the word lines 104 may be parallel to each other and may be arranged perpendicularly to the bit lines 106 (which themselves may be parallel to each other), but any other suitable arrangement may be used. The word lines 104 and/or the bit lines 106 may be formed of any suitable conductive material, such as a metal (e.g., tungsten, copper, titanium, or aluminum). In some embodiments, the memory array 100 depicted in FIG. 1A may be a portion (e.g., a deck 101) of a three-dimensional array in which other arrangements of memory cells 102 like the arrangement in the memory array 100 of FIG. 1A are located at different levels (e.g., above or below the depicted memory array 100). The memory arrays 100 disclosed herein may include one or more decks 101 (e.g., two, three, or four decks 101).

Each memory cell 102 may include a storage element 120 coupled in series with an associated selector device 130. Generally, a storage element 120 may be programmed to a target data state (e.g., corresponding to a particular resistance state) by applying an electric field or energy (e.g., positive or negative voltage or current pulses) to the storage element 120 for a particular duration. In some embodiments, a storage element 120 may include a memory material 110 disposed between a pair of electrodes 108 and 112. In some embodiments, the storage element 120 may be a non-volatile storage element. The storage element 120 may be, for example, a resistive storage element (also referred to herein as a "resistive switch") that, during operation, switches between two different non-volatile states: a high resistance state (HRS) and a low resistance state (LRS). The state of a resistive storage element may be used to represent a data bit (e.g., a "1" for HRS and a "0" for LRS, or vice versa). A resistive storage element may have a voltage threshold beyond which the resistive storage element is in the LRS; driving a resistive storage element into the LRS may be referred to as SET (with an associated SET threshold voltage). Similarly, a resistive storage element may have a voltage threshold beyond which the resistive storage element is in the HRS; driving a resistive storage element into the HRS may be referred to as RESET (with an associated RESET threshold voltage).

The storage element 120 may be, for example, a resistive random access memory (RRAM) device; in such embodiments, the memory material 110 may include an oxygen exchange layer (e.g., hafnium) and an oxide layer, as known in the art. The storage element 120 may be, for example, a metal filament memory device (e.g., a conductive bridging random access memory (CBRAM) device); in such embodiments, the memory material 110 may include a solid electrolyte, one of the electrodes 108 and 112 may be an electrochemically active material (e.g., silver or copper), and the other of the electrodes 108 and 112 may be an inert material (e.g., an inert metal), as known in the art. A chemical barrier layer (e.g., tantalum, tantalum nitride, or tungsten) may be disposed between the electrochemically active electrode and the solid electrolyte to mitigate diffusion of the electrochemically active material into the solid electrolyte, in some such embodiments. In some embodiments, the storage element 120 may be a phase change memory (PCM) device; in such embodiments, the memory material 110 may include a chalcogenide or other phase change memory material. In some embodiments, the storage element 120 may be a magnetoresistive random access memory (M RAM) device; in such embodiments, the electrodes 108 and 112 may be magnetic (e.g., ferromagnetic), and the memory material 110 may be a thin insulating tunnel barrier material. As known in the art, MRAM devices may operate on the principle of tunnel magnetoresistance between two magnetic layers (the electrodes 108 and 112) separated by a tunnel junction (the memory material 110). An MRAM device may have two stable states: when the magnetic moments of the two magnetic layers are aligned parallel to each other, an MRAM device may be in the LRS, and when aligned antiparallel, an MRAM device may be in the HRS. In some embodiments, the storage element 120 may be a spin-transfer torque magnetic random access memory (STT-M RAM) device; in such embodiments, the electrodes 108 and 112 may be magnetic (e.g., ferromagnetic), and the memory material 110 may be a thin metallic tunnel barrier material. Like an MRAM device, an STT-MRAM device may have two stable states: when the magnetic moments of the electrodes 108 and 112 are aligned parallel to each other, an STT-M RAM device may be in the LRS, and when aligned antiparallel, an STT-MRAM device may be in the HRS.

The selector device 130 may be a two-terminal device that may act as a bipolar switch, controlling the flow of current through the storage element 120. In some embodiments, the selector device 130 may include a selector material 114 disposed between a pair of electrodes 112 and 116. Note that, in the embodiment illustrated in FIG. 1A, the electrode 112 of the selector device 130 is "shared" with the storage element 120 in that the electrode 112 acts as an electrode for the selector device 130 and for the storage element 120. In other embodiments of the memory cell 102, the selector device 130 may not share any electrodes with the storage element 120. During manufacture of the memory cell 102, the selector device 130 may be fabricated before or after the storage element 120 is fabricated. Various embodiments of the selector device 130 are discussed in detail below.

Figure 1B:
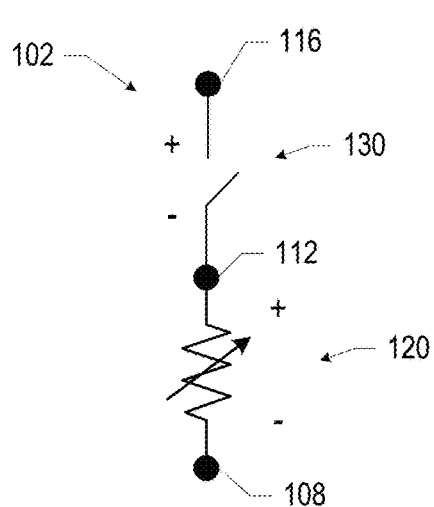
FIG. 1B is a schematic illustration of a memory cell of the memory array of FIG. 1A, in accordance with various embodiments.
Figure 1C:
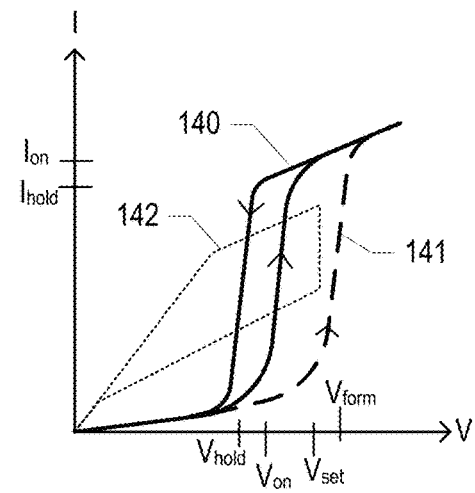
FIG. 1C is a plot depicting example characteristic voltages of the selector device and the storage element of the memory cell of FIGS. 1A and 1B, in accordance with various embodiments.

As illustrated in the schematic view in FIG. 1B of the memory cell 102, when the selector device 130 is in a conductive (i.e., low resistance) state, the "switch" may be closed; when the selector device 130 is in a non-conductive (i.e., high resistance) state, the "switch" may be open. The state of the selector device 130 may change in response to the voltage applied across the selector device 130. FIG. 1C illustrates example electrical characteristics of an example selector device 130 and an example storage element 120 when positive voltages are applied. The I-V characteristic 140 represents behavior of an example selector device 130, and the I-V characteristic 142 represents behavior of an example storage element 120.

As illustrated in FIG. 1C, the selector device 130 may be in a high resistance state (an "off state") when the voltage across the selector device 130 increases from zero to the threshold voltage Von. When the voltage across the selector device 130 reaches and exceeds the threshold voltage Von (and an associated on stage current Ion), the selector device 130 may enter a low resistance state (an "on state") and may conduct current of a positive polarity. When the voltage across the selector device 130 is decreased from the threshold voltage Von, the selector device 130 may remain in the on stage until a holding voltage Vhold (and an associated holding current (hold) is reached. When the voltage across the selector device decreases to and beyond the holding voltage Vhold, the selector device 130 may enter the off state again. In some embodiments, the selector devices 130 disclosed herein may have a threshold voltage Von between 0.4 volts and 2.5 volts, or 1 volt or less. A threshold voltage Von that is less than 2 volts, or less than 1 volt, may be particularly suitable for some embedded memory applications. In some embodiments, the selector devices 130 disclosed herein may have an on stage current Ion that is greater than or equal to 0.5 megaamperes per square centimeter. In some embodiments, the selector devices 130 disclosed herein may have a holding voltage Vhold between 0.1 volts and 2.5 volts (e.g., between 0.1 volts and 1 volt for embedded memory applications, and between 0.5 volts and 2 volts for standalone memory applications).

Note that the holding voltage Vhold may be less than the threshold voltage Von, as illustrated in FIG. 1C. In some embodiments, it may be desirable for the holding voltage Vhold to be approximately the same as, or close to, the threshold voltage Von. In other embodiments, it may be desirable for the holding voltage Vhold to be less than the threshold voltage Von. For example, when the holding voltage Vhold is less than the threshold voltage Von, the voltage across an "on" selector device 130 may be decreased from the threshold voltage Von and the selector device 130 may remain in the on state; this may reduce the power required to keep the selector device 130 on (e.g., during a read operation of the associated storage element 120) and thus may improve power efficiency.

Some selector devices 130 may require or benefit from the application of an initial formation voltage Vform that is larger than the threshold voltage Von when the selector device is first used; FIG. 1C includes a curve 141 illustrating an example initial formation phase. This initial formation phase (sometimes referred to as "first fire") may "break down" the selector material 114 (e.g., by introducing some of the material of the electrodes 112 and 116 into the selector material 114 or creating regions of inhomogeneous material composition in the selector material 114) so as to allow subsequent on/off behavior as described above. As noted above, FIG. 1C also depicts an example I-V characteristic 142 for a storage element 120 (e.g., an RRAM device) with a SET threshold voltage Vset. The SET threshold voltage Vset may be greater than the threshold voltage Von for the selector device 130.

Disclosed herein are selector devices 130 having selector material 114 whose composition may have a higher thermal budget relative to some conventional selector materials. As noted above, some of these selector devices 130 may thus be used in embedded applications (e.g., by including the selector devices 130 in the backend of a die that also includes computing logic, as discussed below).

Figure 2:
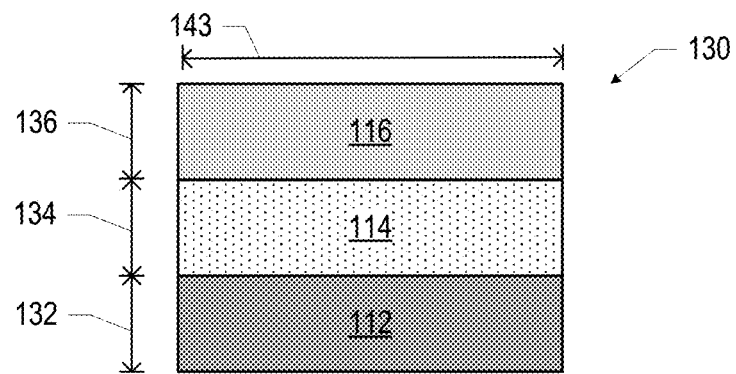
FIG. 2 is a cross-sectional view of an example selector device, in accordance with various embodiments.

The selector devices 130 disclosed herein and the associated memory cells 102 may take any of a number of forms. For example, FIG. 2 is a cross-sectional view of a selector device 130, in accordance with various embodiments. The selector device 130 of FIG. 2 may include an electrode 116, an electrode 112, and a selector material 114 between the electrodes 116 and 112.

The electrodes 112 and 116 may be composed of any suitable material. In some embodiments, the electrodes 112 and 116 may be composed of tantalum, platinum, hafnium, cobalt, indium, iridium, copper, tungsten, ruthenium, palladium, and/or carbon. The electrodes 112 and 116 may be composed of pure forms of these elements, combinations of these elements, or combinations of these elements and other elements, in some embodiments. For example, in some embodiments, the electrode 112 and/or the electrode 116 may include a conductive nitride (e.g., tantalum nitride or titanium nitride). In some embodiments, the material compositions of the electrodes 112 and 116 may be the same, while in other embodiments, the material compositions of the electrodes 112 and 116 may be different.

In some embodiments of the selector devices 130 disclosed herein, the geometries of the electrodes 112 and 116 may be the same or may differ. For example, the electrodes 112 and 116 may have the same or different surface areas. In some embodiments, the cross-sectional width 143 of the electrode 112, the selector material 114, and/or the electrode 116 may be between 5 nanometers and 50 nanometers.

The selector material 114 may be a thin film including germanium, tellurium, and sulfur. The selector material 114 may include less than 50 atomic-percent of germanium. The selector material 114 may have an atomic ratio of sulfur to tellurium that is greater than 1. For example, the selector material 114 may include $Ge_xTe_yS_{1-x-y}$, with x less than 0.5, and $(1-x-y)/y$ greater than 1.

Such selector materials 114 may have a glass transition temperature that is greater than 350 degrees Celsius (e.g., greater than 400 degrees Celsius) and thus may not crystallize at these temperatures. Consequently, these selector materials 114 may be included in selector devices 130 formed during back end of line (BEOL) manufacturing of a die that also includes computing logic, without undergoing significant damage or undesirable modification. Some conventional selector materials (e.g., some conventional chalcogenides) may not have glass transition or crystallization temperatures that enable them to be used in a BEOL process for computing logic.

In some embodiments, the selector material 114 may further include a dopant. The amount and type of dopant may be selected to adjust the crystallization temperature of the selector material 114 (e.g., to increase the crystallization temperature of the selector material 114). In some embodiments, the dopant may include silicon or nitrogen. In some embodiments, the dopant may be present in the selector material at a concentration between 2 atomic-percent and 15 atomic-percent. A dopant included in the selector material 114 may further increase the temperature at which the selector material 114 crystallizes, increasing the thermal budget of the selector material.

The thicknesses of the materials included in the selector device 130 of FIG. 2 may take any suitable values. For example, in some embodiments, the electrode 112 may have a thickness 132 between 1 nanometer and 100 nanometers, the selector material 114 may have a thickness 134 between 2 nanometers and 80 nanometers, and the electrode 116 may have a thickness 136 between 1 nanometer and 100 nanometers. When a selector device 130 is used in conjunction with an STT-M RAM storage element 120 in a memory cell, for example, the thickness 136 of the electrode 116 may be different from the thickness 132 of the electrode 112.

Figure 3:
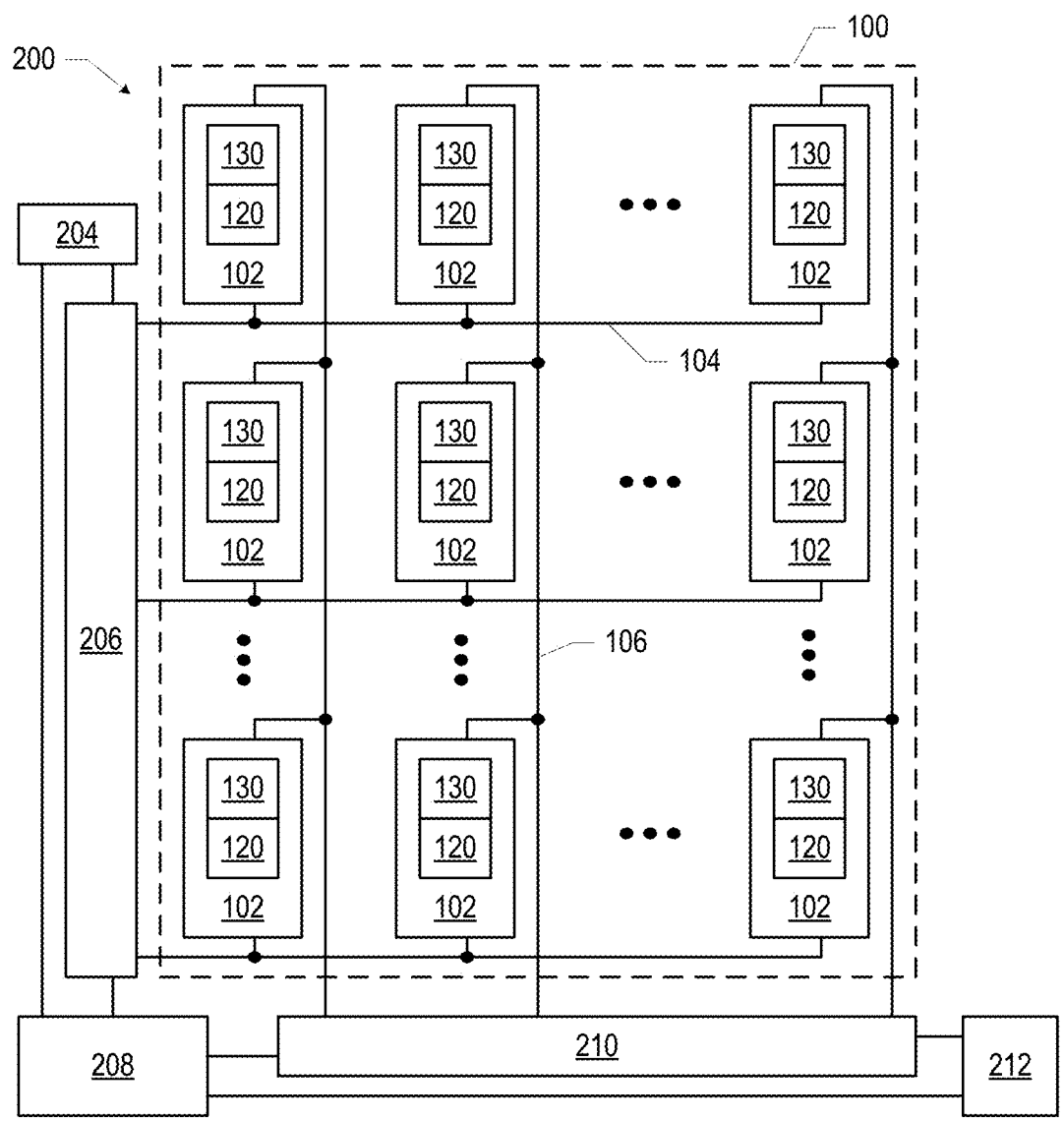
FIG. 3 is a schematic illustration of a memory device including selector devices, in accordance with various embodiments.

A memory array 100 including a selector device 130 may be controlled in any suitable manner. For example, FIG. 3 is a schematic illustration of a memory device 200 including a memory array 100 having memory cells 102 with storage elements 120 and selector devices 130, in accordance with various embodiments. As discussed above, each memory cell 102 may include a storage element 120 connected in series with any of the embodiments of the selector devices 130 disclosed herein. The memory device 200 of FIG. 3 may be a bidirectional cross-point array in which each column is associated with a bit line 106 driven by column select circuitry 210. Each row may be associated with a word line 104 driven by row select circuitry 206. During operation, read/write control circuitry 208 may receive memory access requests (e.g., from one or more processing devices or communication chips of a computing device, such as the computing device 2000 discussed below) and may respond by generating an appropriate control signal (e.g., read, write 0, or write 1), as known in the art. The read/write control circuitry 208 may control the row select circuitry 206 and the column select circuitry 210 to select the desired memory cell(s) 102. Voltage supplies 204 and 212 may be controlled to provide the voltage(s) necessary to bias the memory array 100 to facilitate the requested action on one or more memory cells 102. Row select circuitry 206 and column select circuitry 210 may apply appropriate voltages across the memory array 100 to access the selected memory cells 102 (e.g., by providing appropriate voltages to the memory cells 102 to allow the desired selector devices 130 to conduct). Row select circuitry 206, column select circuitry 210, and read/write control circuitry 208 may be implemented using any devices and techniques known in the art.

Figure 4:
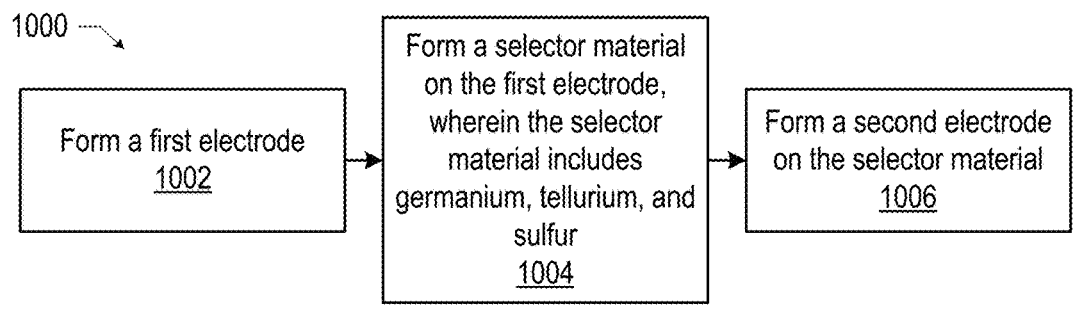
FIG. 4 is a flow diagram of an illustrative method of manufacturing a selector device, in accordance with various embodiments.

Any suitable techniques may be used to manufacture the selector devices 130 and memory cells 102 disclosed herein. FIG. 4 is a flow diagram of an illustrative method 1000 of manufacturing a selector device, in accordance with various embodiments. Although the operations discussed below with reference to the method 1000 are illustrated in a particular order and depicted once each, these operations may be repeated or performed in a different order (e.g., in parallel), as suitable. Additionally, various operations may be omitted, as suitable. Various operations of the method 1000 may be illustrated with reference to one or more of the embodiments discussed above, but the method 1000 may be used to manufacture any suitable selector device (including any suitable ones of the embodiments disclosed herein).

At 1002, a first electrode may be formed (e.g., by physical vapor deposition (PVD), such as sputtering). For example, the electrode 112 may be formed on the memory material 110 of a storage element 120. The first electrode may take any of the forms disclosed herein.

At 1004, a selector material may be formed on the first electrode. The selector material may include germanium, tellurium, and sulfur. For example, the selector material 114 may be formed on the electrode 112 using PVD (e.g., radio frequency or pulsed DC sputtering) or atomic layer deposition (ALD). The selector material may take any of the forms disclosed herein (e.g., $Ge_xTe_yS_{1-x-y}$, with x less than 0.5, and (1-x-y)/y greater than 1).

At 1006, a second electrode may be formed on the selector material. For example, the electrode 116 may be formed on the selector material 114. The second electrode may take any of the forms disclosed herein.

Figure 5:
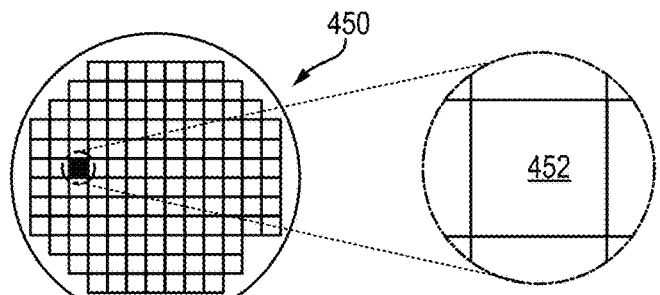
FIG. 5 depicts top views of a wafer and dies that may include any of the selector devices or memory cells disclosed herein.

The selector devices 130 and memory cells 102 disclosed herein may be included in any suitable electronic device. FIG. 5 depicts top views of a wafer 450 and dies 452 that may be formed from the wafer 450; the dies 452 may include any of the selector devices 130 or memory cells 102 disclosed herein. The wafer 450 may include semiconductor material and may include one or more dies 452 having integrated circuit (IC) elements (e.g., selector devices 130 and storage elements 120) formed on a surface of the wafer 450. Each of the dies 452 may be a repeating unit of a semiconductor product that includes any suitable device (e.g., the memory device 200). After the fabrication of the semiconductor product is complete, the wafer 450 may undergo a singulation process in which the dies 452 are separated from one another to provide discrete "chips" of the semiconductor product. A die 452 may include one or more selector devices 130 or memory cells 102 and/or supporting circuitry to route electrical signals to the selector devices 130 or memory cells 102 (e.g., interconnects including conductive lines 104 and 106), as well as any other IC components. In some embodiments, the wafer 450 or the die 452 may include other memory devices, logic devices (e.g., AND, OR, NAND, or NOR gates), or any other suitable circuit element. Multiple ones of these devices may be combined on a single die 452. For example, a memory device formed by multiple memory arrays (e.g., multiple memory arrays 100) may be formed on a same die 452 as a processing device (e.g., the processing device 2002 of FIG. 8) or other logic that is configured to store information in the memory devices or execute instructions stored in the memory array.

Figure 6:
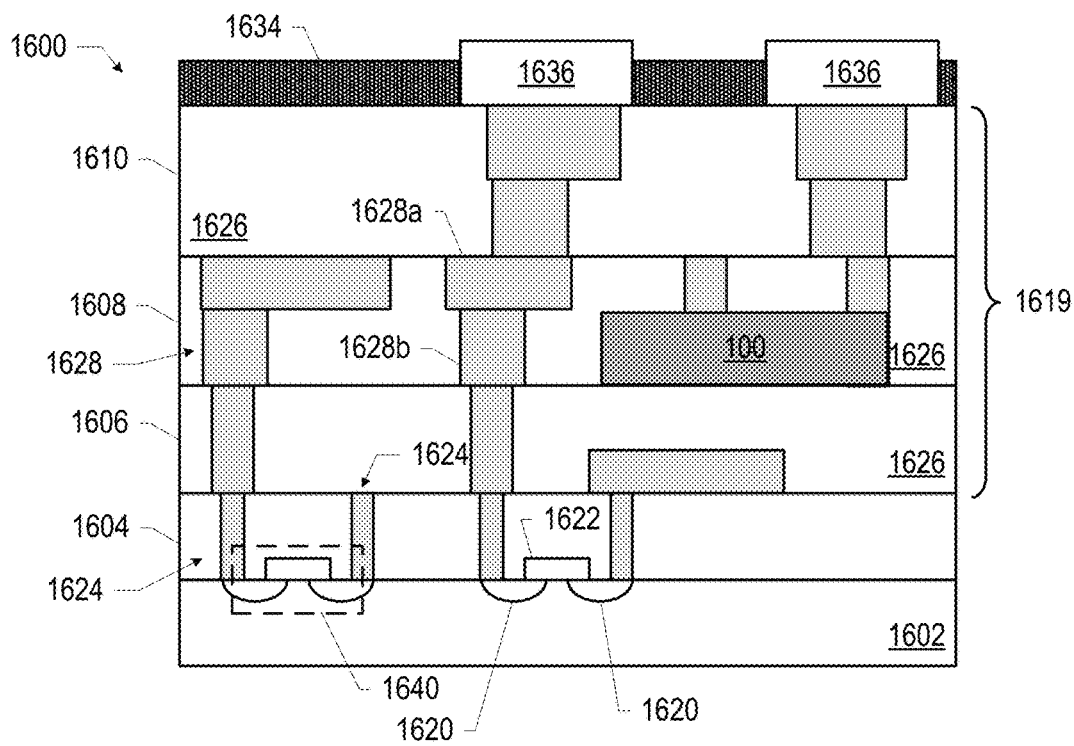
FIG. 6 is a cross-sectional side view of an integrated circuit (IC) device that may include any of the selector devices or memory cells disclosed herein.

FIG. 6 is a cross-sectional side view of an IC device 1600 that may include any of the selector devices 130 or memory cells 102 disclosed herein. The IC device 1600 may be formed on a substrate 1602 (e.g., the wafer 450 of FIG. 5) and may be included in a die (e.g., the die 452 of FIG. 5). The substrate 1602 may be a semiconductor substrate composed of semiconductor material systems including, for example, n-type or p-type materials systems (or a combination of both). The substrate 1602 may include, for example, a crystalline substrate formed using a bulk silicon or a silicon-on-insulator (SOI) substructure. In some embodiments, the substrate 1602 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the substrate 1602. Although a few examples of materials from which the substrate 1602 may be formed are described here, any material that may serve as a foundation for an IC device 1600 may be used. The substrate 1602 may be part of a singulated die (e.g., the dies 452 of FIG. 5) or a wafer (e.g., the wafer 450 of FIG. 5).

The IC device 1600 may include one or more device layers 1604 disposed on the substrate 1602. The device layer 1604 may include features of one or more transistors 1640 (e.g., metal oxide semiconductor field-effect transistors (MOSFETs)) formed on the substrate 1602. The device layer 1604 may include, for example, one or more source and/or drain (S/D) regions 1620, a gate 1622 to control current flow in the transistors 1640 between the S/D regions 1620, and one or more S/D contacts 1624 to route electrical signals to/from the S/D regions 1620. The transistors 1640 may include additional features not depicted for the sake of clarity, such as device isolation regions, gate contacts, and the like. The transistors 1640 are not limited to the type and configuration depicted in FIG. 5 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon and nanowire transistors.

Each transistor 1640 may include a gate 1622 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 1640 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, and conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 1640 along the source-channel-drain direction, the gate electrode may consist of a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1620 may be formed within the substrate 1602 adjacent to the gate 1622 of each transistor 1640. The S/D regions 1620 may be formed using an implantation/diffusion process or an etching/deposition process, for example. In the former process, dopants such as boron, aluminum, antimony, phosphorous, or arsenic may be ion-implanted into the substrate 1602 to form the S/D regions 1620. An annealing process that activates the dopants and causes them to diffuse farther into the substrate 1602 may follow the ion-implantation process. In the latter process, the substrate 1602 may first be etched to form recesses at the locations of the S/D regions 1620. An epitaxial deposition process may then be carried out to fill the recesses with material that is used to fabricate the S/D regions 1620. In some implementations, the S/D regions 1620 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1620 may be formed using one or more alternate semiconductor materials such as germanium or a group III-V material or alloy. In further embodiments, one or more layers of metal and/or metal alloys may be used to form the S/D regions 1620.

Electrical signals, such as power and/or input/output (I/O) signals, may be routed to and/or from the devices (e.g., transistors 1640) of the device layer 1604 through one or more interconnect layers disposed on the device layer 1604 (illustrated in FIG. 6 as interconnect layers 1606-1610). For example, electrically conductive features of the device layer 1604 (e.g., the gate 1622 and the S/D contacts 1624) may be electrically coupled with the interconnect structures 1628 of the interconnect layers 1606-1610. The one or more interconnect layers 1606-1610 may form a metallization stack (also referred to as an "ILD stack") 1619 of the IC device 1600.

In some embodiments, one or more selector devices 130, memory cells 102, and/or memory arrays 100 may be disposed in one or more of the interconnect layers 1606-1610, in accordance with any of the techniques disclosed herein. FIG. 5 illustrates a single memory array 100 in the interconnect layer 1608 for illustration purposes, but any number and structure of memory arrays 100, memory cells 102, and/or selector devices 130 may be included in any one or more of the layers in a metallization stack 1619 (e.g., memory arrays 100 with one or more decks 101 of memory cells 102). A memory array 100 included in the metallization stack 1619, in combination with computing logic (e.g., some or all of the transistors 1640) in the IC device 1600, may be referred to as an "embedded" memory array, as discussed above. In embodiments in which the IC device 1600 does not include any computing logic but does include one or more memory arrays 100, the IC device 1600 may be referred to as a "standalone" memory device. One or more selector devices 130, memory cells 102, and/or memory arrays 100 in the metallization stack 1619 may be coupled to any suitable ones of the devices in the device layer 1604, and/or to one or more of the conductive contacts 1636 (discussed below).

The interconnect structures 1628 may be arranged within the interconnect layers 1606-1610 to route electrical signals according to a wide variety of designs (in particular, the arrangement is not limited to the particular configuration of interconnect structures 1628 depicted in FIG. 5). Although a particular number of interconnect layers 1606-1610 is depicted in FIG. 5, embodiments of the present disclosure include IC devices having more or fewer interconnect layers than depicted.

In some embodiments, the interconnect structures 1628 may include lines 1628a and/or vias 1628b filled with an electrically conductive material such as a metal. The lines 1628a may be arranged to route electrical signals in a direction of a plane that is substantially parallel with a surface of the substrate 1602 upon which the device layer 1604 is formed. For example, the lines 1628a may route electrical signals in a direction in and out of the page from the perspective of FIG. 5. The vias 1628b may be arranged to route electrical signals in a direction of a plane that is substantially perpendicular to the surface of the substrate 1602 upon which the device layer 1604 is formed. In some embodiments, the vias 1628b may electrically couple lines 1628a of different interconnect layers 1606-1610 together.

The interconnect layers 1606-1610 may include a dielectric material 1626 disposed between the interconnect structures 1628, as shown in FIG. 5. In some embodiments, the dielectric material 1626 disposed between the interconnect structures 1628 in different ones of the interconnect layers 1606-1610 may have different compositions; in other embodiments, the composition of the dielectric material 1626 between different interconnect layers 1606-1610 may be the same.

A first interconnect layer 1606 (referred to as Metal 1 or "M1") may be formed directly on the device layer 1604. In some embodiments, the first interconnect layer 1606 may include lines 1628a and/or vias 1628b, as shown. The lines 1628a of the first interconnect layer 1606 may be coupled with contacts (e.g., the S/D contacts 1624) of the device layer 1604.

A second interconnect layer 1608 (referred to as Metal 2 or "M2") may be formed directly on the first interconnect layer 1606. In some embodiments, the second interconnect layer 1608 may include vias 1628b to couple the lines 1628a of the second interconnect layer 1608 with the lines 1628a of the first interconnect layer 1606. Although the lines 1628a and the vias 1628b are structurally delineated with a line within each interconnect layer (e.g., within the second interconnect layer 1608) for the sake of clarity, the lines 1628a and the vias 1628b may be structurally and/or materially contiguous (e.g., simultaneously filled during a dual-damascene process) in some embodiments.

A third interconnect layer 1610 (referred to as Metal 3 or "M3") (and additional interconnect layers, as desired) may be formed in succession on the second interconnect layer 1608 according to similar techniques and configurations described in connection with the second interconnect layer 1608 or the first interconnect layer 1606. In some embodiments, the interconnect layers that are "higher up" in the metallization stack 1619 in the IC device 1600 (i.e., further away from the device layer 1604) may be thicker.

The IC device 1600 may include a solder resist material 1634 (e.g., polyimide or similar material) and one or more conductive contacts 1636 formed on the interconnect layers 1606-1610. In FIG. 5, the conductive contacts 1636 are illustrated as taking the form of bond pads. The conductive contacts 1636 may be electrically coupled with the interconnect structures 1628 and configured to route the electrical signals of the transistor(s) 1640 to other external devices. For example, solder bonds may be formed on the one or more conductive contacts 1636 to mechanically and/or electrically couple a chip including the IC device 1600 with another component (e.g., a circuit board). The IC device 1600 may include additional or alternate structures to route the electrical signals from the interconnect layers 1606-1610; for example, the conductive contacts 1636 may include other analogous features (e.g., posts) that route the electrical signals to external components.

Figure 7:
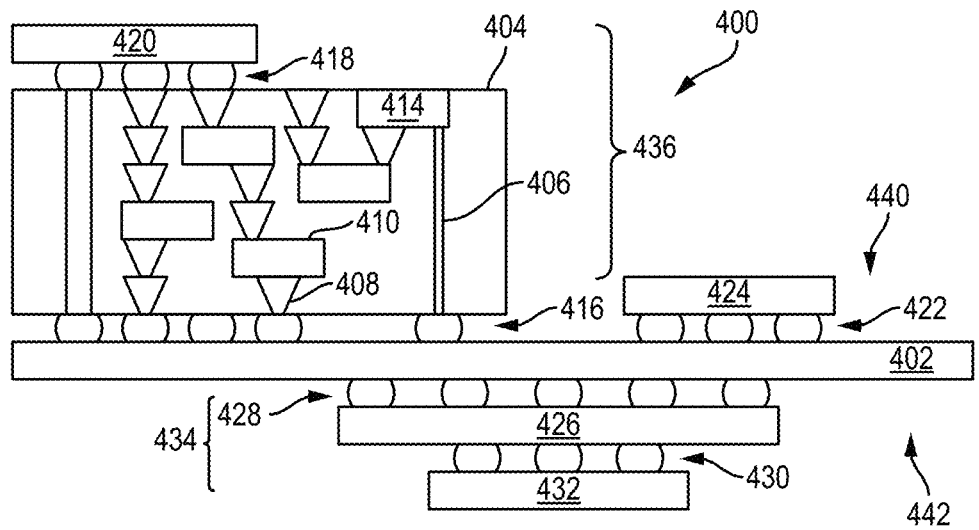
FIG. 7 is a cross-sectional side view of a device assembly that may include any of the selector devices or memory cells disclosed herein.

FIG. 7 is a cross-sectional side view of a device assembly 400 that may include any of the selector devices 130 or memory cells 102 disclosed herein in one or more packages. A "package" may refer to an electronic component that includes one or more IC devices (e.g., the IC devices 1600 discussed above with reference to FIG. 6) that are structured for coupling to other components; for example, a package may include a die coupled to a package substrate that provides electrical routing and mechanical stability to the die. The device assembly 400 includes a number of components disposed on a circuit board 402. The device assembly 400 may include components disposed on a first face 440 of the circuit board 402 and an opposing second face 442 of the circuit board 402; generally, components may be disposed on one or both faces 440 and 442.

In some embodiments, the circuit board 402 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 402. In other embodiments, the circuit board 402 may be a package substrate or flexible board.

The device assembly 400 illustrated in FIG. 7 includes a package-on-interposer structure 436 coupled to the first face 440 of the circuit board 402 by coupling components 416. The coupling components 416 may electrically and mechanically couple the package-on-interposer structure 436 to the circuit board 402 and may include solder balls, male and female portions of a socket, an adhesive, an underfill material, and/or any other suitable electrical and/or mechanical coupling structure.

The package-on-interposer structure 436 may include a package 420 coupled to an interposer 404 by coupling components 418. The coupling components 418 may take any suitable form for the application, such as the forms discussed above with reference to the coupling components 416. Although a single package 420 is shown in FIG. 7, multiple packages may be coupled to the interposer 404; indeed, additional interposers may be coupled to the interposer 404. The interposer 404 may provide an intervening substrate used to bridge the circuit board 402 and the package 420. The package 420 may include one or more selector devices 130 or memory cells 102, for example. Generally, the interposer 404 may spread a connection to a wider pitch or reroute a connection to a different connection. For example, the interposer 404 may couple the package 420 (e.g., a die) to a ball grid array (BGA) of the coupling components 416 for coupling to the circuit board 402. In the embodiment illustrated in FIG. 7, the package 420 and the circuit board 402 are attached to opposing sides of the interposer 404; in other embodiments, the package 420 and the circuit board 402 may be attached to a same side of the interposer 404. In some embodiments, three or more components may be interconnected by way of the interposer 404.

The interposer 404 may be formed of an epoxy resin, a fiberglass-reinforced epoxy resin, a ceramic material, or a polymer material such as polyimide. In some embodiments, the interposer 404 may be formed of alternate rigid or flexible materials that may include the same materials described above for use in a semiconductor substrate, such as silicon, germanium, and other group III-V and group IV materials. The interposer 404 may include metal interconnects 408 and vias 410, including but not limited to through-silicon vias (TSVs) 406. The interposer 404 may further include embedded devices 414, including both passive and active devices. Such devices may include, but are not limited to, capacitors, decoupling capacitors, resistors, inductors, fuses, diodes, transformers, sensors, electrostatic discharge (ESD) devices, and memory devices (e.g., the selector devices 130 or memory cells 102). More complex devices such as radio frequency (RF) devices, power amplifiers, power management devices, antennas, arrays, sensors, and microelectromechanical systems (MEMS) devices may also be formed on the interposer 404. The package-on-interposer structure 436 may take the form of any of the package-on-interposer structures known in the art.

The device assembly 400 may include a package 424 coupled to the first face 440 of the circuit board 402 by coupling components 422. The coupling components 422 may take the form of any of the embodiments discussed above with reference to the coupling components 416, and the package 424 may take the form of any of the embodiments discussed above with reference to the package 420. The package 424 may include one or more selector devices 130 or memory cells 102, for example.

The device assembly 400 illustrated in FIG. 7 includes a package-on-package structure 434 coupled to the second face 442 of the circuit board 402 by coupling components 428. The package-on-package structure 434 may include a package 426 and a package 432 coupled together by coupling components 430 such that the package 426 is disposed between the circuit board 402 and the package 432. The coupling components 428 and 430 may take the form of any of the embodiments of the coupling components 416 discussed above, and the packages 426 and 432 may take the form of any of the embodiments of the package 420 discussed above. Each of the packages 426 and 432 may include one or more selector devices 130 or memory cells 102, for example.

Figure 8:
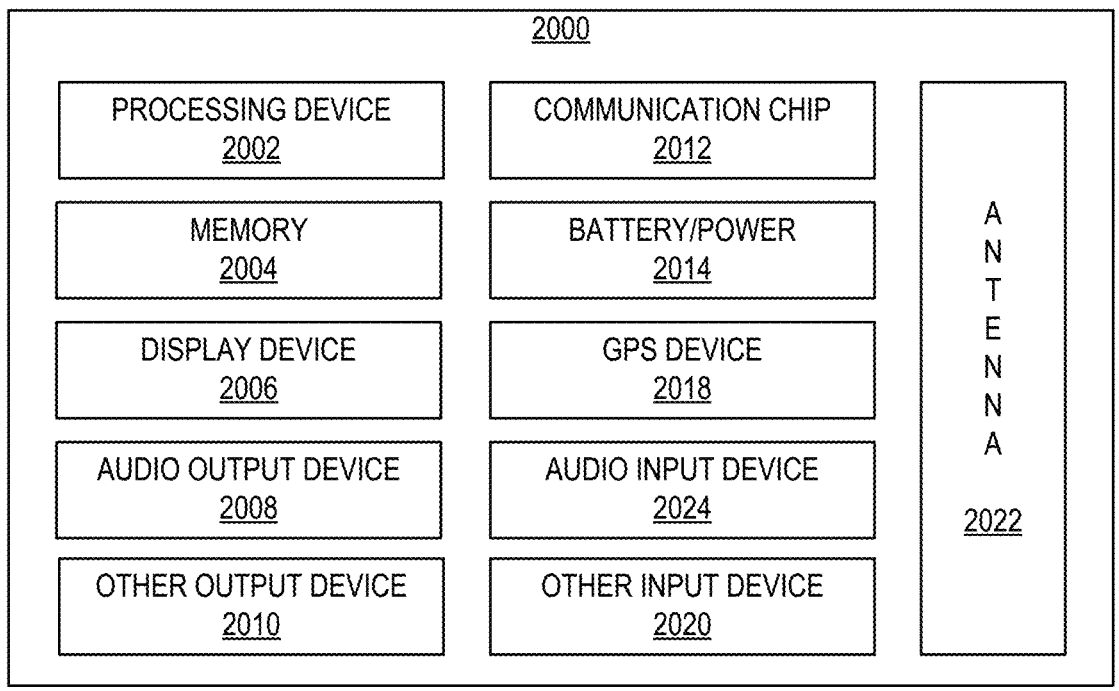
FIG. 8 is a block diagram of an example computing device that may include any of the selector devices or memory cells disclosed herein, in accordance with various embodiments.

FIG. 8 is a block diagram of an example computing device 2000 that may include any of the selector devices 130 or memory cells 102 disclosed herein. A number of components are illustrated in FIG. 8 as included in the computing device 2000, but any one or more of these components may be omitted or duplicated, as suitable for the application. In some embodiments, some or all of the components included in the computing device 2000 may be attached to one or more PCBs (e.g., a motherboard). In some embodiments, various ones of these components may be fabricated onto a single system-on-a-chip (SoC) die. Additionally, in various embodiments, the computing device 2000 may not include one or more of the components illustrated in FIG. 8, but the computing device 2000 may include interface circuitry for coupling to the one or more components. For example, the computing device 2000 may not include a display device 2006 but may include display device interface circuitry (e.g., a connector and driver circuitry) to which a display device 2006 may be coupled. In another set of examples, the computing device 2000 may not include an audio input device 2024 or an audio output device 2008 but may include audio input or output device interface circuitry (e.g., connectors and supporting circuitry) to which an audio input device 2024 or audio output device 2008 may be coupled.

The computing device 2000 may include a processing device 2002 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2002 may interface with one or more of the other components of the computing device 2000 (e.g., the communication chip 2012 discussed below, the display device 2006 discussed below, etc.) in a conventional manner. The processing device 2002 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. In some embodiments, the processing device 2002 may include computing logic that is part of a die that includes embedded memory, such as any of the memory cells 102 and/or memory arrays 100 disclosed herein.

The computing device 2000 may include a memory 2004, which may itself include one or more memory devices such as volatile memory (e.g., dynamic random access memory (DRAM)), non-volatile memory (e.g., read-only memory (ROM)), flash memory, solid state memory, and/or a hard drive. The memory 2004 may include one or more selector devices 130 or memory cells 102 or memory arrays 100 or memory devices 200, as disclosed herein. In some embodiments, the memory 2004 may include memory that shares a die with the processing device 2002. This memory may be used as cache memory and may include embedded dynamic random access memory (eDRAM) or STT-M RAM.

In some embodiments, the computing device 2000 may include a communication chip 2012 (e.g., one or more communication chips). For example, the communication chip 2012 may be configured for managing wireless communications for the transfer of data to and from the computing device 2000. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2012 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2012 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2012 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2012 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2012 may operate in accordance with other wireless protocols in other embodiments. The computing device 2000 may include an antenna 2022 to facilitate wireless communications and/or to receive other wireless communications (such as AM or FM radio transmissions).

In some embodiments, the communication chip 2012 may manage wired communications, such as electrical, optical, or any other suitable communication protocols (e.g., the Ethernet). As noted above, the communication chip 2012 may include multiple communication chips. For instance, a first communication chip 2012 may be dedicated to shorter-range wireless communications such as Wi-Fi or Bluetooth, and a second communication chip 2012 may be dedicated to longer-range wireless communications such as global positioning system (GPS), EDGE, GPRS, CDMA, WiMAX, LTE, EV-DO, or others. In some embodiments, a first communication chip 2012 may be dedicated to wireless communications, and a second communication chip 2012 may be dedicated to wired communications.

The computing device 2000 may include battery/power circuitry 2014. The battery/power circuitry 2014 may include one or more energy storage devices (e.g., batteries or capacitors) and/or circuitry for coupling components of the computing device 2000 to an energy source separate from the computing device 2000 (e.g., AC line power).

The computing device 2000 may include a display device 2006 (or corresponding interface circuitry, as discussed above). The display device 2006 may include any visual indicators, such as a heads-up display, a computer monitor, a projector, a touchscreen display, a liquid crystal display (LCD), a light-emitting diode display, or a flat panel display.

The computing device 2000 may include an audio output device 2008 (or corresponding interface circuitry, as discussed above). The audio output device 2008 may include any device that generates an audible indicator, such as speakers, headsets, or earbuds.

The computing device 2000 may include an audio input device 2024 (or corresponding interface circuitry, as discussed above). The audio input device 2024 may include any device that generates a signal representative of a sound, such as microphones, microphone arrays, or digital instruments (e.g., instruments having a musical instrument digital interface (MIDI) output).

The computing device 2000 may include a GPS device 2018 (or corresponding interface circuitry, as discussed above). The GPS device 2018 may be in communication with a satellite-based system and may receive a location of the computing device 2000, as known in the art.

The computing device 2000 may include an other output device 2010 (or corresponding interface circuitry, as discussed above). Examples of the other output device 2010 may include an audio codec, a video codec, a printer, a wired or wireless transmitter for providing information to other devices, or an additional storage device.

The computing device 2000 may include an other input device 2020 (or corresponding interface circuitry, as discussed above). Examples of the other input device 2020 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2000 or a subset of its components may have any appropriate form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device.

The following paragraphs provide various examples of the embodiments disclosed herein.

Example 1 is a selector device, including: a first electrode; a second electrode; and a selector material between the first electrode and the second electrode, wherein the selector material includes germanium, tellurium, and sulfur, the selector material includes less than 50 atomic-percent of germanium, and the selector material has an atomic ratio of sulfur to tellurium that is greater than 1.

Example 2 may include the subject matter of Example 1, and may further specify that the selector material further includes silicon.

Example 3 may include the subject matter of Example 2, and may further specify that the selector material includes between 2 atomic-percent and 15 atomic-percent of silicon.

Example 4 may include the subject matter of any of Examples 1-3, and may further specify that the selector material further includes nitrogen.

Example 5 may include the subject matter of Example 4, and may further specify that the selector material includes between 2 atomic-percent and 15 atomic-percent of nitrogen.

Example 6 may include the subject matter of any of Examples 1-5, and may further specify that the selector material includes $Ge_xTe_yS_{1-x-y}$.

Example 7 may include the subject matter of any of Examples 1-6, and may further specify that the selector material has a thickness between 2 nanometers and 80 nanometers.

Example 8 may include the subject matter of any of Examples 1-7, and may further specify that the first electrode or the second electrode includes tantalum, platinum, hafnium, cobalt, indium, iridium, copper, or tungsten.

Example 9 may include the subject matter of any of Examples 1-8, and may further specify that the selector device has a threshold voltage that is less than 1 volt.

Example 10 may include the subject matter of any of Examples 1-9, and may further specify that the selector device has a holding voltage between 0.1 volts and 1 volt.

Example 11 may include the subject matter of any of Examples 1-10, and may further specify that at least one of the first electrode and the second electrode is shared with a storage element.

Example 12 may include the subject matter of Example 11, and may further specify that the storage element is a resistive random access memory (RRAM) device, a phase change memory (PCM) device, or a spin-transfer torque magnetic random access memory (STT-MRAM) device.

Example 13 is a memory array, including a memory cell, wherein the memory cell includes a storage element and a selector device coupled to the storage element, wherein the selector device includes a selector material, the selector material includes germanium, tellurium, and sulfur, the selector material includes less than 50 atomic-percent of germanium, and the selector material has an atomic ratio of sulfur to tellurium that is greater than 1.

Example 14 may include the subject matter of Example 13, and may further specify that the selector device includes a first electrode and a second electrode, the selector material is between the first electrode and the second electrode, and the first electrode or the second electrode is also an electrode of the storage element.

Example 15 may include the subject matter of any of Examples 13-14, and may further specify that the selector material further includes a dopant.

Example 16 may include the subject matter of any of Examples 13-15, and may further specify that the memory array includes a plurality of memory cells.

Example 17 may include the subject matter of Example 16, and may further specify that the plurality of memory cells is arranged in multiple decks of memory cells.

Example 18 may include the subject matter of any of Examples 13-17, and may further specify that the storage element is a resistive random access memory (RRAM) device, a phase change memory (PCM) device, or a spin-transfer torque magnetic random access memory (STT-MRAM) device.

Example 19 may include the subject matter of any of Examples 13-18, and may further specify that the memory cell includes a first terminal coupled to a bit line, and the memory cell includes a second terminal coupled to a word line.

Example 20 is a method of manufacturing a selector device, including: forming a first electrode; forming a selector material on the first electrode, wherein the selector material includes germanium, tellurium, and sulfur, the selector material includes less than 50 atomic-percent of germanium, and the selector material has an atomic ratio of sulfur to tellurium that is greater than 1; and forming a second electrode on the selector material.

Example 21 may include the subject matter of Example 20, and may further specify that forming the selector material includes physical vapor deposition of the selector material.

Example 22 may include the subject matter of any of Examples 20-21, and may further specify that forming the selector material includes sputtering the selector material.

Example 23 may include the subject matter of Example 20, and may further specify that forming the selector material includes atomic layer deposition of the selector material.

Example 24 may include the subject matter of any of Examples 20-23, and may further specify that the selector material further includes a dopant having a concentration between 2 atomic-percent and 15 atomic-percent.

Example 25 may include the subject matter of any of Examples 20-24, and may further include forming a storage element in series with the selector device.

Example 26 may include the subject matter of Example 25, and may further specify that the first electrode is shared with the storage element.

Example 27 may include the subject matter of Example 25, and may further specify that the second electrode is shared with the storage element.

Example 28 is a computing device, including: a circuit board; and a die communicatively coupled to the circuit board, wherein the die includes a memory array, the memory array includes a memory cell having a storage element coupled in series with a selector device, the selector device includes a selector material, and the selector material includes germanium, tellurium, and sulfur.

Example 29 may include the subject matter of Example 28, and may further specify that the selector material includes less than 50 atomic-percent of germanium.

Example 30 may include the subject matter of any of Examples 28-29, and may further specify that the selector material has an atomic ratio of sulfur to tellurium that is greater than 1.

Example 31 may include the subject matter of any of Examples 28-30, and may further specify that the die further includes computing logic.

Example 32 may include the subject matter of any of Examples 28-31, and may further include a wireless communications device coupled to the circuit board.

Example 33 may include the subject matter of any of Examples 28-32, and may further specify that the storage element includes a resistive random access memory (RRAM) device, a phase change memory (PCM) device, or a spin-transfer torque magnetic random access memory (STT-MRAM) device.

The invention claimed is:

1. A selector device, comprising:
   a first electrode;
   a second electrode; and
   a selector material between the first electrode and the second electrode, wherein the selector material includes germanium, tellurium, and sulfur, the selector material includes less than 50 atomic-percent of germanium, and the selector material has an atomic ratio of sulfur to tellurium that is greater than 1.

2. The selector device of claim 1, wherein the selector material further includes silicon.

3. The selector device of claim 2, wherein the selector material includes between 2 atomic-percent and 15 atomic-percent of silicon.

4. The selector device of claim 1, wherein the selector material further includes nitrogen.

5. The selector device of claim 4, wherein the selector material includes between 2 atomic-percent and 15 atomic-percent of nitrogen.

6. The selector device of claim 1, wherein the selector material includes $Ge_xTe_yS_{1-x-y}$.

7. The selector device of claim 1, wherein the selector material has a thickness between 2 nanometers and 80 nanometers.

8. The selector device of claim 1, wherein the first electrode or the second electrode includes tantalum, platinum, hafnium, cobalt, indium, iridium, copper, or tungsten.

9. The selector device of claim 1, wherein the selector device has a threshold voltage that is less than 1 volt.

10. The selector device of claim 1, wherein the selector device has a holding voltage between 0.1 volts and 1 volt.

11. A memory array, comprising:
a memory cell, including a storage element and a selector device coupled to the storage element, wherein the selector device includes a selector material, the selector material includes germanium, tellurium, and sulfur, the selector material includes less than 50 atomic-percent of germanium, and the selector material has an atomic ratio of sulfur to tellurium that is greater than 1.

12. The memory array of claim 11, wherein the memory array includes a plurality of memory cells.

13. The memory array of claim 12, wherein the plurality of memory cells is arranged in multiple decks of memory cells.

14. The memory array of claim 11, wherein the selector device includes a first electrode and a second electrode, the selector material is between the first electrode and the second electrode, and the first electrode or the second electrode is also an electrode of the storage element.

15. The memory array of claim 11, wherein the selector material further includes a dopant.

16. The memory array of claim 11, wherein the storage element is a resistive random access memory (RRAM) device, a phase change memory (PCM) device, or a spin-transfer torque magnetic random access memory (STT-MRAM) device.

17. The memory array of claim 11, wherein the memory cell includes a first terminal coupled to a bit line, and the memory cell includes a second terminal coupled to a word line.

18. A computing device, comprising:
a circuit board; and
a die communicatively coupled to the circuit board, wherein the die includes a memory array, the memory array includes a memory cell having a storage element coupled in series with a selector device, the selector device includes a selector material, the selector material includes germanium, tellurium, and sulfur, and the selector material has an atomic ratio of sulfur to tellurium that is greater than 1.

19. The computing device of claim 18, wherein the die further includes computing logic.

* * * * *